(12) United States Patent
Swanson et al.

(10) Patent No.: US 6,376,859 B1
(45) Date of Patent: Apr. 23, 2002

(54) VARIABLE POROSITY POROUS SILICON ISOLATION

(75) Inventors: Leland S. Swanson, McKinney; Keith A. Joyner, Richardson, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/346,763

(22) Filed: Jul. 1, 1999

Related U.S. Application Data

(60) Provisional application No. 60/094,503, filed on Jul. 29, 1998.

(51) Int. Cl.⁷ .............................................. H01L 29/04
(52) U.S. Cl. ............................ 257/49; 257/82; 257/84; 257/638
(58) Field of Search ........................... 257/638, 49, 82, 257/84

(56) References Cited

U.S. PATENT DOCUMENTS

| | | | |
|---|---|---|---|
| 3,954,523 A | * 5/1976 | Magdo et al. | 148/175 |
| 4,180,416 A | * 12/1979 | Brock | 148/1.5 |
| 5,525,374 A | * 6/1996 | Ritland et al. | 427/376.1 |
| 5,767,020 A | 6/1998 | Sakaguchi et al. | 438/705 |
| 5,767,561 A | * 6/1998 | Frei et al. | 257/499 |
| 5,914,183 A | * 6/1999 | Canham | 428/312.6 |
| 6,008,540 A | * 12/1999 | Lu et al. | 257/758 |

OTHER PUBLICATIONS

Imai, et al., "Full Isolation Technology by Porous Oxidized Silicon and Its Application to LSIs", 1981 IEEE, IEDM 81–376—IEDM 81–379.
Zorinsky, et al., "The Islands Method—A Manufacturable Porous Silicon SOI Technology", 1986 IEEE, IEDM 86–431—IEDM 86–434.
Patent Abstracts Of Japan; "Semiconductor Basic Material and Production Thereof"; No. 09–162090; pub. date Jun. 20, 1997; S. Nobuhiko, et al.

* cited by examiner

*Primary Examiner*—Fetsum Abraham
(74) *Attorney, Agent, or Firm*—Jacqueline J. Garner; W. James Brady, III; Frederick J. Telecky, Jr.

(57) ABSTRACT

Varying the porosity through the thickness of a porous silicon layer allows conflicting needs to be met by the same layer: a low porosity surface layer allows a high-quality epitaxial layer of silicon to be grown, or can provide structural support, while greater porosity in other portions of the layer increases circuit isolation and provides stress relief between layers.

13 Claims, 3 Drawing Sheets

VARIABLE POROSITY POROUS SILICON ISOLATION

This application claim priority under 35 USC §119(e)(1) of provisional application number 60/094,503 filed Jul. 29, 1998.

BACKGROUND AND SUMMARY OF THE INVENTION

The present invention relates to integrated circuit structures and fabrication methods, and especially to techniques for creating silicon-on-insulator substrates.

Background: Porous Silicon

Porous silicon is formed by anodic oxidation of a silicon wafer in a solution of hydrofluoric acid and a surfactant, such as ethanol. The size of the pores, the porosity, and the thickness of the porous silicon can be controlled; pore size is typically in the range of 10–20 nm, while porosity is typically in the range of 30–70 percent.

Porous silicon has a low dielectric constant and high resistivity, which make it useful for isolation. Since porous silicon has a high surface area for its volume (a few hundred square meters per cubic centimeter), it can be oxidized much more quickly than bulk silicon.

One prior use of porous silicon is in FIPOS—full isolation by porous oxidized silicon, which uses an epitaxial layer grown on a heavily-doped silicon surface. The heavily-doped layer is selectively converted to porous silicon by anodization through holes in the epitaxial layer, then oxidized to form a buried layer of oxide.

Variable Porosity Porous Silicon

The present application discloses varying the porosity throughout a layer of porous silicon. For example, low porosity is advantageous to provide a good surface for epitaxial silicon growth and to provide material strength, while high porosity layers provide better isolation and a reduction of stresses between the porous silicon and the substrate. Variable porosity allows these different requirements to be met by varied regions within the layer.

Advantages of the disclosed methods include the ability to optimize a layer of porous silicon to meet the opposing requirements.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1A shows a variable porosity porous silicon layer which will be used in an SOI substrate, while

DETAILED DESCRIPTION OF THE PREFERRED EMBODIMENT

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview

In general, the layer of porous silicon is formed by anodic oxidation of the top layer of a silicon wafer. The electrolyte is generally hydrofluoric acid (HF) with water and a surfactant, e.g., a $HF/C_2H_5OH/H_2O$ solution of approximately 1:2:1. The formation of pores begins at the exposed surface of the silicon wafer and proceeds isotropically. Preferably (but not necessarily) the exposed surface is oxidized with a low current density to create a low porosity surface portion. The current density is then increased to give a higher porosity which is optimized for the particular process and provides better isolation. Preferably (but not necessarily) the oxidation ends with formation of a high porosity region at the interface to the silicon substrate to provide stress relief between the two layers.

First Embodiment: Use in SOI

Provisional patent application No. 60/086,959, filed May 28, 1998, which is hereby incorporated by reference, discloses a layer of porous silicon to be used in the formation of an SOI substrate. That process, which can use the disclosed variable porosity porous silicon, will now be discussed with reference to FIGS. 2A–E, which show a cross-section of the wafer at various points in the disclosed process.

Figure 1A:
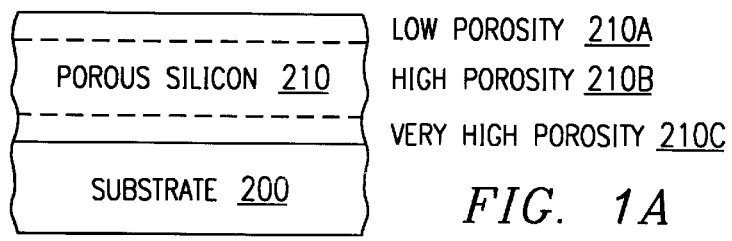
Figure 2A:
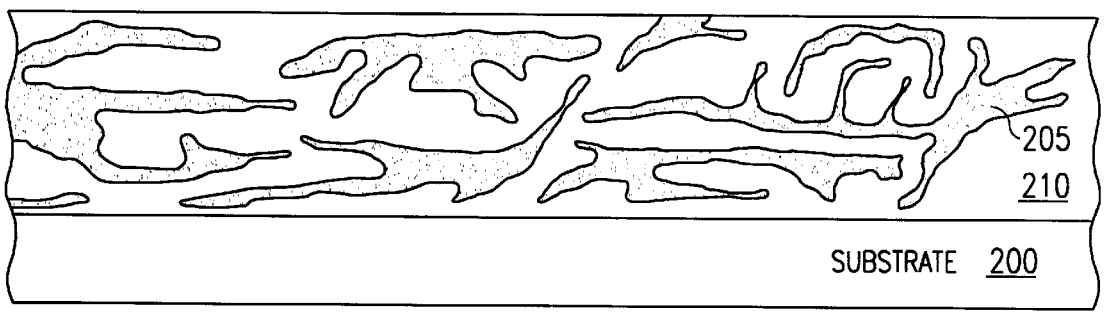
FIGS. 2A–E are cross-sections of a partially fabricated integrated circuit structure, showing formation of the disclosed SOI structure, as well as formation of transistors.

A boron-doped silicon substrate 200 is anodically oxidized to form a layer of porous silicon 210, seen in FIG. 2A. FIG. 1A is a simplification of FIG. 2A, showing only porous silicon layer 210 and substrate 200. For the outer layer 210A, where an epitaxial layer is to be grown, a current density of approximately 1–10 mA/cm2 is used to create a region of low porosity (approximately 15–35 percent) which is approximately 10–50 nm thick. The current density is then increased to approximately 10–100 mA/cm2 to create a porosity of about 30–70 percent in region 210B, which is approximately 5 micron thick. For region 210C, which is nearest the substrate, a current density of approximately 35–100 mA/cm2 is used to create a region approximately 50–500 nm thick and having a porosity of about 60–80 percent. This high porosity layer provides stress relief between the porous silicon layer and the underlying substrate.

Figure 2B:
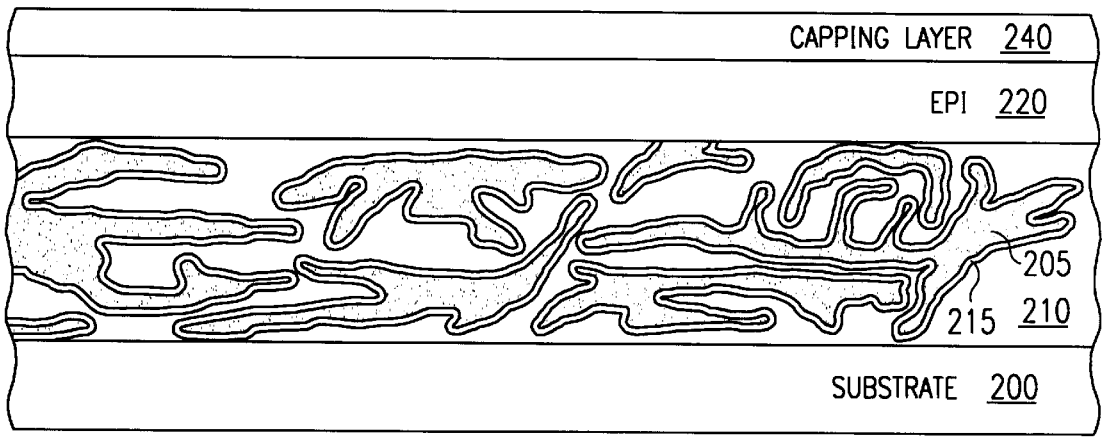

As seen in FIG. 2B, partial oxidation of the porous silicon is performed, forming regions of $SiO_2$ 215 on the surface of the pores 205. A short dip in HF, or a plasma etch, is used to remove the oxide from the top surface of the wafer. Once the surface oxide is removed, the wafer is heated in an atmosphere of $H_2$ at 900–1100 degrees C. for approximately 5–10 minutes to allow the crystalline silicon to reflow and seal the pores on the surface, making the wafer surface once again single crystal silicon. Epitaxial layer 220 is then grown on the porous silicon 210 and a capping layer 240 is formed on the epitaxial layer, such as chemical-vapor-deposited (CVD) $Si_3N_4$. The capping layer provides structural support to the thin epitaxial layer during the anneal to follow.

Figure 2C:
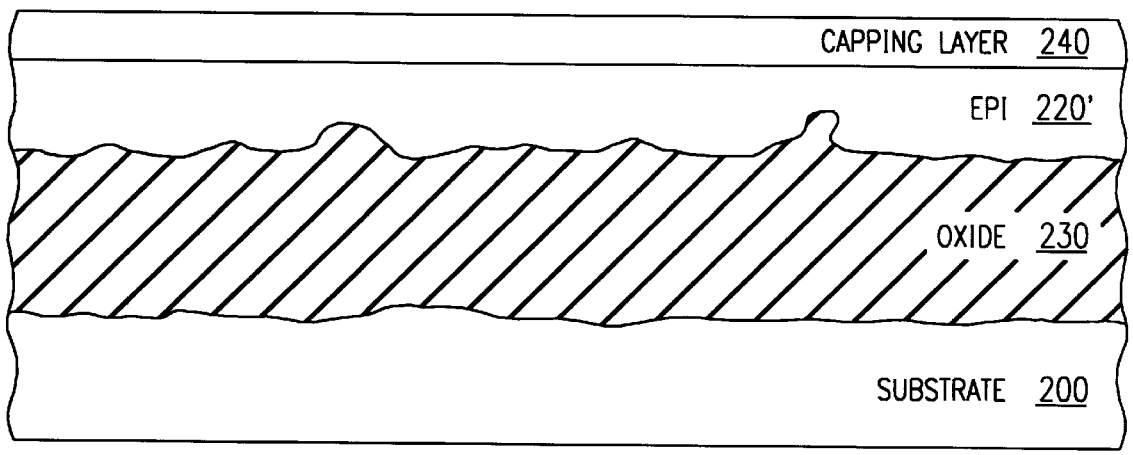
Figure 2D:
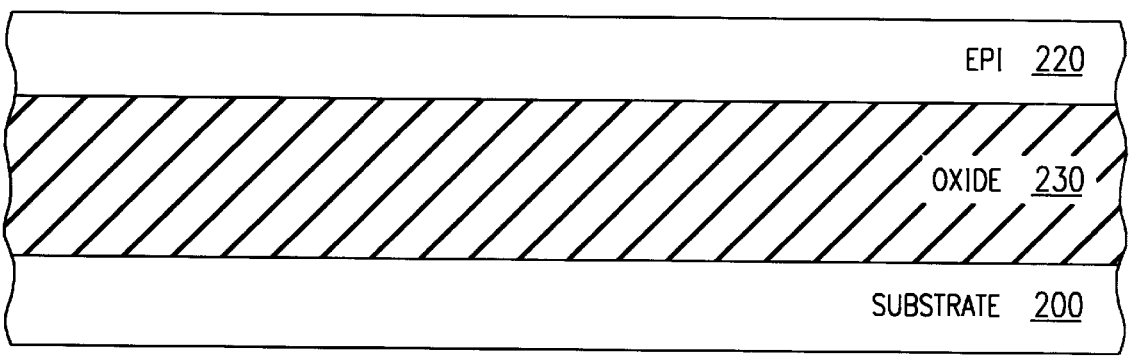
Figure 2E:
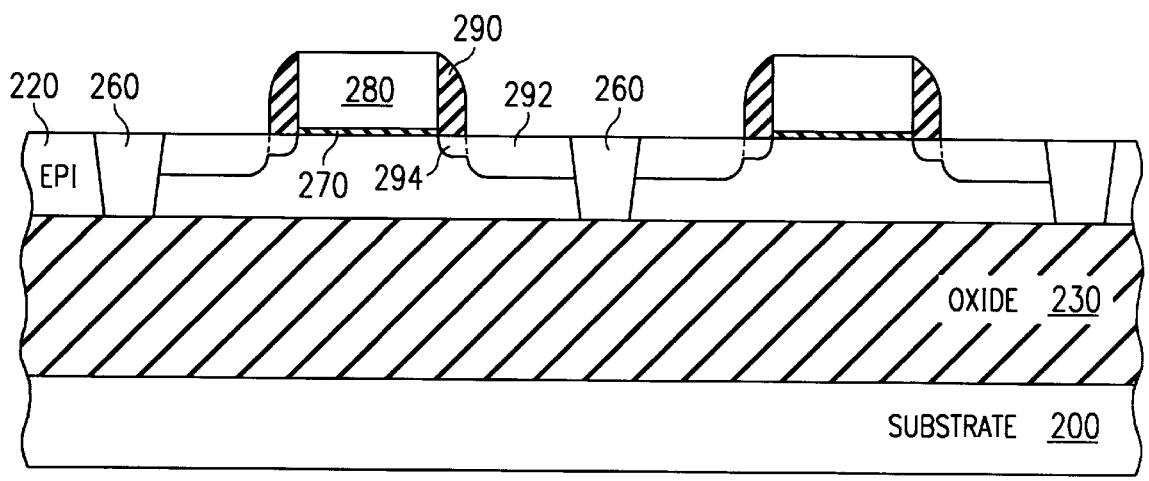

The wafer is then annealed at approximately 1325 degrees C. for approximately six hours. At this temperature, the silicon and silicon dioxide will begin to flow and separate. Over time, the partially-oxidized porous silicon layer separates and coalesces into an oxide layer 230 between slightly thickened epitaxial and substrate layers. FIG. 2C shows the layers when this process is partially complete, showing an irregular boundary between the substrate 200, oxide layer 230, and epitaxial region 220. After the anneal is complete (i.e., interfaces are smooth), the wafer is cooled, then the nitride capping layer can either be stripped, or left on to facilitate formation of further isolation structures, such as shallow trench isolation (STI). FIG. 2D shows the wafer after stripping of the nitride layer. Formation of transistors can then proceed. FIG. 2E shows partially fabricated transistors, with trench isolation 260, gate oxide 270, gate 280, sidewall spacers 290, and implanted regions 292 and 294, all overlying the buried oxide layer 230.

Second Embodiment: Use in RF

Provisional patent application No. 60/069,522, filed Dec. 12, 1997, which is hereby incorporated by reference, discloses a method for forming vertical substrate isolation in radio frequency (RF) circuits by a patterned anodic oxidation of the substrate to selectively form porous silicon in desired areas. A variable porosity porous silicon can be used in this application, which will now be discussed with reference to FIGS. 3A–D.

Figure 3A:
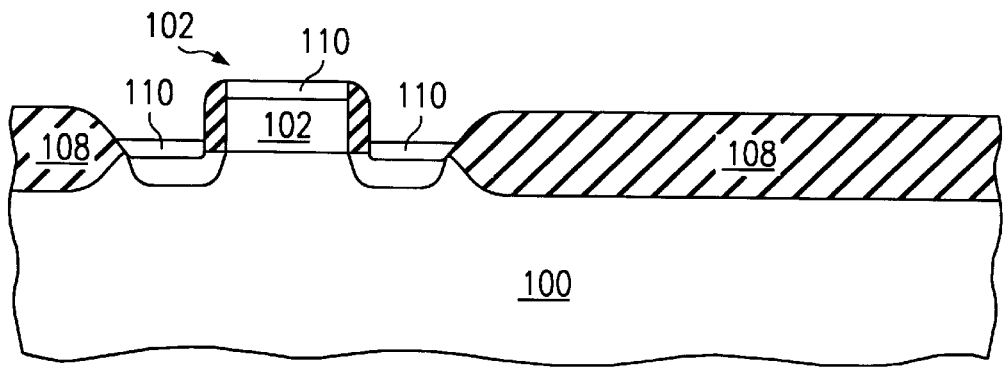
FIGS. 3A–C are cross-sections of a partially fabricated integrated circuit structure, showing formation of the disclosed RF isolation structures.
Figure 3B:
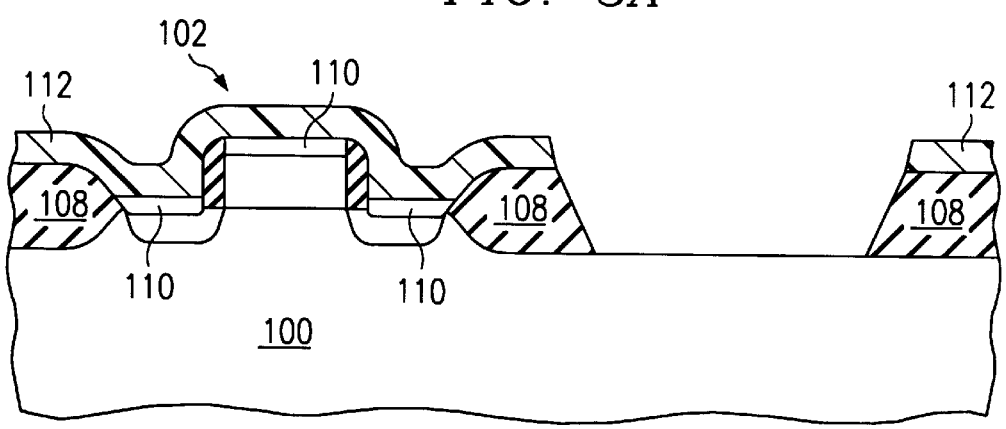
Figure 3C:
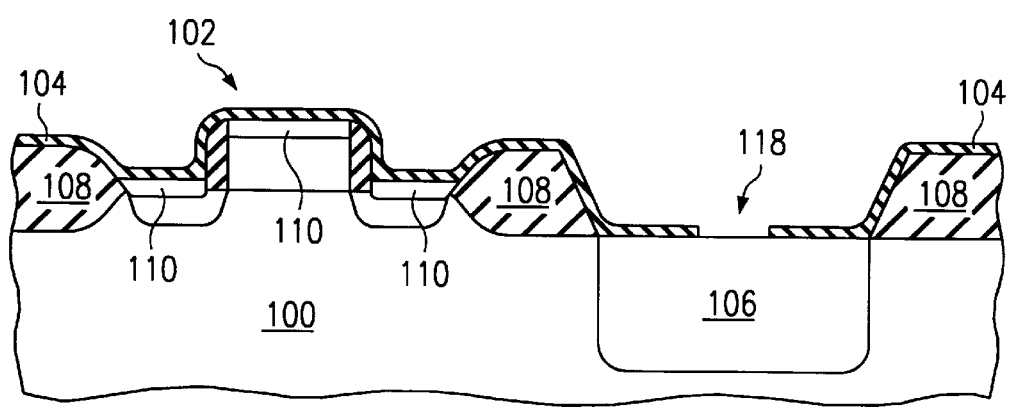

In this embodiment, as seen in FIG. 3A, field oxide 108 is grown and transistors 102 are formed, including silicide 110.

A resist layer 112 is deposited and patterned to expose the field oxide in those areas in which porous silicon isolation is desired. Exposed portions of field oxide 108 are removed, giving the structure of FIG. 3B, followed by ashing of the resist.

A hard mask layer 104, e.g. of SiC, is deposited and patterned, by means of a resist layer, to provide opening 118, which is approximately in the center of the area where the porous silicon is desired. Anodic oxidation is then performed to create region 106 of porous silicon.

Figure 1B:
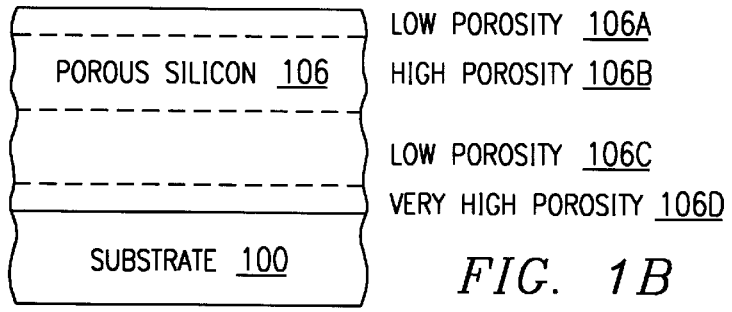
FIG. 1B shows a variable porosity porous silicon layer to be used in RF isolation.

A simplified version of the isolation areas is seen in FIG. 1B, region 106, which overlies substrate 100 has four regions of different porosities. In the uppermost region 106A, a current density of approximately 1–40 mA/cm2 is used to create a region about 50–500 nm thick, having a porosity of approximately 25–50 percent. This low porosity provides desirable material strength in the region of porous silicon.

The current density is then changed to about 35–100 mA/cm2 to create a porosity of approximately 60–80 percent in region 106B. The thickness of this region will be about 30 percent of the total thickness of the porous silicon region and provides the major part of the isolation. Next, a current density of approximately 1–40 mA/cm2 forms region 106C with a porosity of about 25–50 percent to provide further material strength. This region has a thickness about 20 percent of the total thickness of the layer.

Finally, a current density of about 35–100 mA/cm2 forms final region 106D, which is about 1 micron thick. A porosity of about 60–80 percent provides stress reduction between the porous silicon and the underlying substrate.

After formation of the porous silicon regions, processing of the wafer continues with deposition of the interlevel dielectric and formation of metallization layers.

Third Embodiment: Use in Mixed Signal Applications

Patent application Ser. No. 09/120,215, filed Jul. 21, 1998, which is hereby incorporated by reference, discloses a method for forming lateral porous silicon isolation in high frequency and mixed signal circuits. The use of a variable porosity porous silicon in this application will now be discussed with reference to FIGS. 4A–B.

Figure 4A:
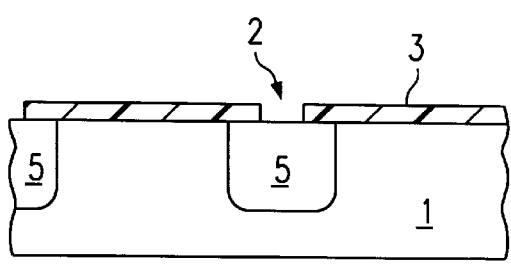
FIGS. 4A–B are cross-sections of a partially fabricated integrated circuit structure, showing formation of the disclosed mixed signal isolation structures.
Figure 4B:
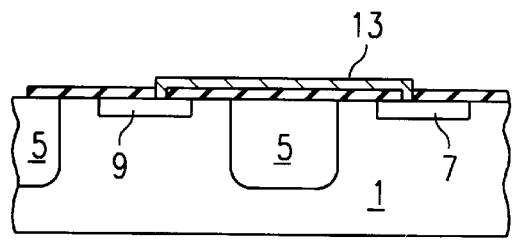

In FIG. 4A, silicon substrate 1 is overlain by a mask layer 3, e.g. of silicon carbide, except in windows 2 where the formation of porous silicon is desired. Regions of porous silicon 5 are formed through windows 2 using, e.g., a process such as described above for the RF embodiment.

After stripping of the SiC layer, digital circuitry 7 and analog circuitry 9 are formed in different regions of the wafer, separated by the porous silicon. A dielectric can be formed over the surface of the wafer, with interconnects 13 connecting the digital and analog circuitry, at least some of the interconnects crossing the region of porous silicon.

Alternate Solutions for Anodic Oxidation

In the anodic oxidation process, other surfactants can be used, such as methanol, isopropanol, and TritonX-100, the latter a wetting agent well known in the industry. It appears in preliminary tests that TritonX-100 can be used in much smaller quantities, e.g. 1–3 percent of the total solution. Additionally, the literature on anodic oxidation includes references to numerous organics which are being investigated. Thus, the wetting agents mentioned do not constitute an exhaustive list, but merely a sample of the possibilities.

In addition to changing the surfactant used, the proportions of the materials can be changed to produce porous silicon with the desired characteristics.

Alternate Embodiment: Varying Electrolyte

In a less preferred embodiment, the porosity can also be modified by changing the electrolyte concentrations, with lower HF concentrations yielding higher porosity. It is anticipated, however, that it will be important not to expose the wafer to air, e.g., by pulling the wafer from one electrolyte bath and immersing in another bath during the anodization process. This embodiment is considerably slower than the preferred embodiment, since once the electrolyte were altered, it would be necessary to allow time for the concentration change to wick back into the pores before anodization could be continued. For example, the electrolyte concentration can be changed by pumping in more water to reduce HF levels and increase porosity, but a waiting period is necessary to allow the electrolyte concentrations to approach equilibrium within the pores before the current is turned on.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be obvious to one of ordinary skill in the art that the disclosed embodiments are not the only instances in which variable porosity can be created in a porous silicon structure. The disclosed process can be used in many other applications which utilize porous silicon.

In alternate embodiments, the variable porosity can be produced in porous silicon layers used in other isolation structures, with appropriate modification of the parameters.

In a further alternate embodiment, the isolation for RF applications can be performed prior to the formation of transistors.

What is claimed is:

1. An integrated circuit structure, comprising:
   a substrate defining a planar dimension and comprising:
   a non-porous portion;
   a region of porous silicon, wherein the porosity of said region varies in a predictable manner and comprising:
   a first region along an upper surface removed from said non-porous portion and aligned generally along the planar dimension, wherein the first region has a first porosity;

a second region between the first region and the non-porous portion and aligned generally along the planar dimension, wherein the second region has a second porosity; and wherein said second porosity is greater than said first porosity.

2. The integrated circuit of claim 1, further comprising an epitaxial layer on a first surface of said region of porous silicon.

3. The integrated circuit of claim 1, wherein said region of porous silicon provides lateral isolation for circuit elements.

4. The integrated circuit of claim 1, wherein said region of porous silicon provides vertical isolation for circuit elements.

5. The integrated circuit of claim 1:

and further comprising a plurality of circuit elements formed in fixed relationships with respect to said substrate; and wherein said region of porous silicon provides lateral isolation for the plurality of circuit elements.

6. The integrated circuit of claim 1:

and further comprising a plurality of circuit elements formed in fixed relationships with respect to said substrate; and wherein said region of porous silicon provides vertical isolation for the plurality of circuit elements.

7. The integrated circuit of claim 1:

wherein said first porosity is on an order of about 15–35 percent; and wherein said second porosity is on an order of about 30–70 percent.

8. The integrated circuit of claim 1:

wherein said region of porous silicon has a third porosity at locations adjacent said non-porous portion; and wherein said third porosity is greater than said second porosity.

9. The integrated circuit of claim 8:

wherein said first porosity is on an order of about 15–35 percent;

wherein said second porosity is on an order of about 30–70 percent; and wherein said third porosity is on an order of about 60–80 percent.

10. The integrated circuit of claim 8, further comprising an epitaxial layer on a first surface of said region of porous silicon.

11. The integrated circuit of claim 8:

wherein said region of porous silicon has a fourth porosity at locations between said locations below said upper surface and said locations adjacent said non-porous portion; and wherein said third porosity is greater than said fourth porosity.

12. The integrated circuit of claim 11:

wherein said first porosity is on an order of about 25–50 percent;

wherein said second porosity is on an order of about 60–80 percent;

wherein said third porosity is on an order of about 60–80 percent;

wherein said fourth porosity is on an order of about 25–50 percent.

13. The integrated circuit of claim 11:

and further comprising a plurality of circuit elements formed in fixed relationships with respect to said substrate; and wherein said region of porous silicon provides vertical isolation for the plurality of circuit elements.

* * * * *